United States Patent
Chu et al.

(10) Patent No.: US 9,964,573 B2
(45) Date of Patent: May 8, 2018

(54) METHOD FOR MEASURING CHARACTERISTIC IMPEDANCE OF ELECTRIC TRANSMISSION LINE

(71) Applicant: Alpha Networks Inc., Hsinchu (TW)

(72) Inventors: Chun-Hsueh Chu, Hsinchu (TW); Rong-Fa Kuo, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 100 days.

(21) Appl. No.: 15/246,734

(22) Filed: Aug. 25, 2016

(65) Prior Publication Data

US 2017/0192043 A1     Jul. 6, 2017

(30) Foreign Application Priority Data

Jan. 5, 2016   (TW) .............................. 105100209 A (51) Int. Cl.
| | |
|---|---|
| G01R 27/04 | (2006.01) |
| G01R 27/00 | (2006.01) |
| G01R 27/16 | (2006.01) |
| G01R 27/28 | (2006.01) |
| G01R 27/06 | (2006.01) |

(52) U.S. Cl.
CPC ............ *G01R 27/16* (2013.01); *G01R 27/04* (2013.01); *G01R 27/28* (2013.01); *G01R 27/06* (2013.01)

(58) Field of Classification Search
CPC ........ G01R 27/16; G01R 27/04; G01R 27/06; G01R 27/28
USPC ........................................ 324/638, 639, 600
See application file for complete search history.

(56) References Cited

U.S. PATENT DOCUMENTS

| | | | |
|---|---|---|---|
| 7,994,801 | B2 | 8/2011 | Hagerup et al. |
| 2008/0278176 | A1 | 11/2008 | Hagerup et al. |
| 2008/0309354 | A1* | 12/2008 | Hsu .................... G01R 27/04 |
| | | | 324/705 |
| 2011/0102007 | A1 | 5/2011 | Ghadaksaz |

FOREIGN PATENT DOCUMENTS

| | | |
|---|---|---|
| CN | 202256606 | 5/2012 |
| JP | 2001194397 | 7/2001 |
| TW | 200712506 | 4/2007 |
| TW | 201040547 | 11/2010 |

OTHER PUBLICATIONS

Taiwan Intellectual Property Office, "Office Action Search report" dated Jun. 24, 2016.

* cited by examiner

*Primary Examiner* — Amy He
(74) *Attorney, Agent, or Firm* — WPAT, PC (57) ABSTRACT

A characteristic impedance of an electric transmission line is measured by way of extraction. In the method, a first probe and a second probe are provided, wherein the first probe and the second probe are separable and independently operable probes. A first characteristic impedance of a first circuit where a first terminal of the first probe and a first terminal of the second probe are directly interconnected to each other is first measured. Then a second characteristic impedance of a second circuit where the first terminal of the first probe and the first terminal of the second probe are connected to opposite terminals of the electric transmission line, respectively, is measured. The characteristic impedance of the electric transmission line can then be obtained according to the first characteristic impedance and the second characteristic impedance.

9 Claims, 6 Drawing Sheets

METHOD FOR MEASURING
CHARACTERISTIC IMPEDANCE OF
ELECTRIC TRANSMISSION LINE

FIELD OF THE INVENTION

The present invention relates to a method for measuring a characteristic impedance of an electric transmission line, and more particularly to a method for measuring a characteristic impedance of an electric transmission line by way of extraction.

BACKGROUND OF THE INVENTION

As known, high-frequency electronic devices play an important role in modern technologies. With substantial increase of operational frequencies, a variety of problems are possibly caused in printed circuit boards (PCBs) themselves, configuration of integrated circuits (ICs) in PCBs, and interconnection structures such as back planes or connectors for physically connecting to active devices or power supplies. Due to the electric properties of the signal transmission structures, problems in power integrity and electromagnetic interference, etc., might occur or get worse. Therefore, manufacturing difficulty and hardware cost would rise.

For solving the above-mentioned problems, factors associated with high-frequency signal transmission are studied and controlled. For example, characteristic impedance of a transmission line is an important controllable factor for improving signal transmission efficiency.

So far, a variety of measuring techniques adapted for high frequency signals have been proposed to control characteristic impedance of a transmission line. For example, in one of the measuring techniques, a Sub Miniature A (SMA) connector is disposed at an edge of a PCB, and used as an input and output point of a measurement signal. Unfortunately, the design of the connector is confined due to the size requirement. As known to those skilled in the art, for SMA I/O connectors with 3.5 mm or 2.92 mm female connectors, there should be a clearance of 12 mm or more between terminals of two connectors to avoid unexpected contact. In another example, for Bayonet Neill-Concelman (BNC) coaxial cable connectors, a terminal of a connector needs to be kept 20 mm or more away from a terminal of another connector to make connection feasible.

To avoid such confining conditions, a high frequency and low cost probe means is proposed to measure properties of high-speed PCB signals lines. Please refer to FIG. 1. A probe 10 includes an SMA connector 12 and a needle 14. When a Vector Network Analyzer (VNA) is used to execute measurement of characteristic impedance, e.g. S-parameter, two probes 10 are disposed at two ends of a high-speed/high-frequency signal line, respectively, wherein one of the two probes 10 serves as an input point and the other serves as an output point. Accordingly, it is understood that the measured characteristic impedance would contain mixed characteristic impedances of internal elements, connecting coaxial cables, connectors, probes and high-speed PCB signal lines.

Figure 1:
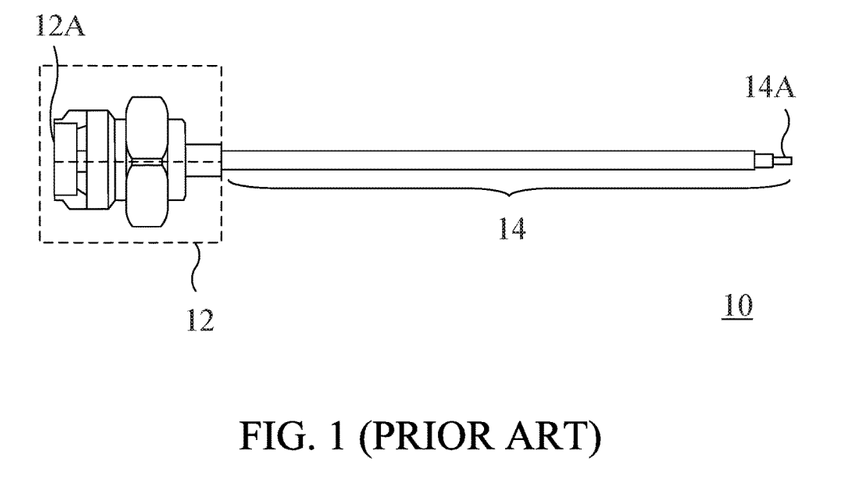
FIG. 1 is a schematic diagram illustrating a structure of a probe that is conventionally used for measurement of characteristic impedance.

Since it is necessary to specifically realize the characteristic impedance of a specific target to be measured, e.g. a high-speed PCB signal line, calibration of the instrument is essential to measurement precision. When conducting calibration, a Vector Network Analyzer measures an object whose characteristic impedance is well known or partially known first. The measured data are then referred to for correcting deviation of the system so as to isolate the desired characteristic impedance of a high-speed PCB signal line from the mixed one containing the characteristic impedances of internal elements, connecting coaxial cables, connectors and probes. In other words, as illustrated in FIG. 1, a reference plane can be established at the needle tip 14A of the probe 10.

Conventionally, four measuring ways, including open-circuit, short-circuit, applying load and transmitting thru, are used for measurement of characteristic impedance for calibration in order to move the reference plane to the needle tip of the probe. Generally, the measuring means are provided by VNA manufacturers, and can only be used with some specific probes for calibration unless specifically prepared carriers are used. The carries need to be specifically designed for different circuit boards, so time and cost would be additionally spent. Furthermore, the carriers might not be adapted for measurement of other kinds of objects.

In other words, the conventional measuring means are limited in many ways and lack of flexibility.

SUMMARY OF THE INVENTION

Therefore, the present invention provides a method for measuring characteristic impedance of an electric transmission line in a flexible manner while saving time and cost for calibration.

The present invention further provides a method for measuring a characteristic impedance of an electric transmission line, which comprises: providing a first probe and a second probe, wherein the first probe and the second probe are separable and independently operable probes; measuring a first characteristic impedance of a first circuit where a first terminal of the first probe and a first terminal of the second probe are directly interconnected to each other; measuring a second characteristic impedance of a second circuit where the first terminal of the first probe and the first terminal of the second probe are connected to opposite terminals of the electric transmission line, respectively; and obtaining the characteristic impedance of the electric transmission line according to the first characteristic impedance and the second characteristic impedance.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

The invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
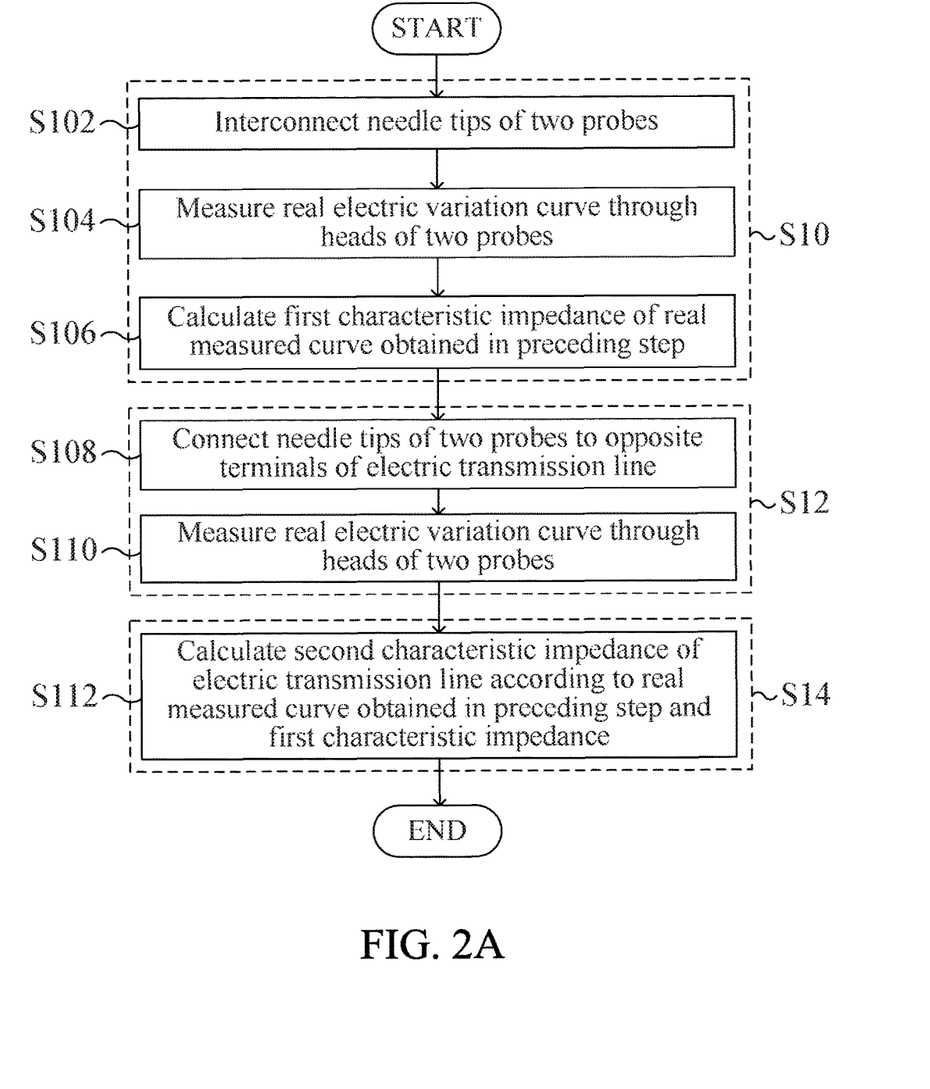
FIG. 2A is a flowchart schematically illustrating a method for measuring characteristic impedance of an electric transmission line according to an embodiment of the present invention.
Figure 3A:
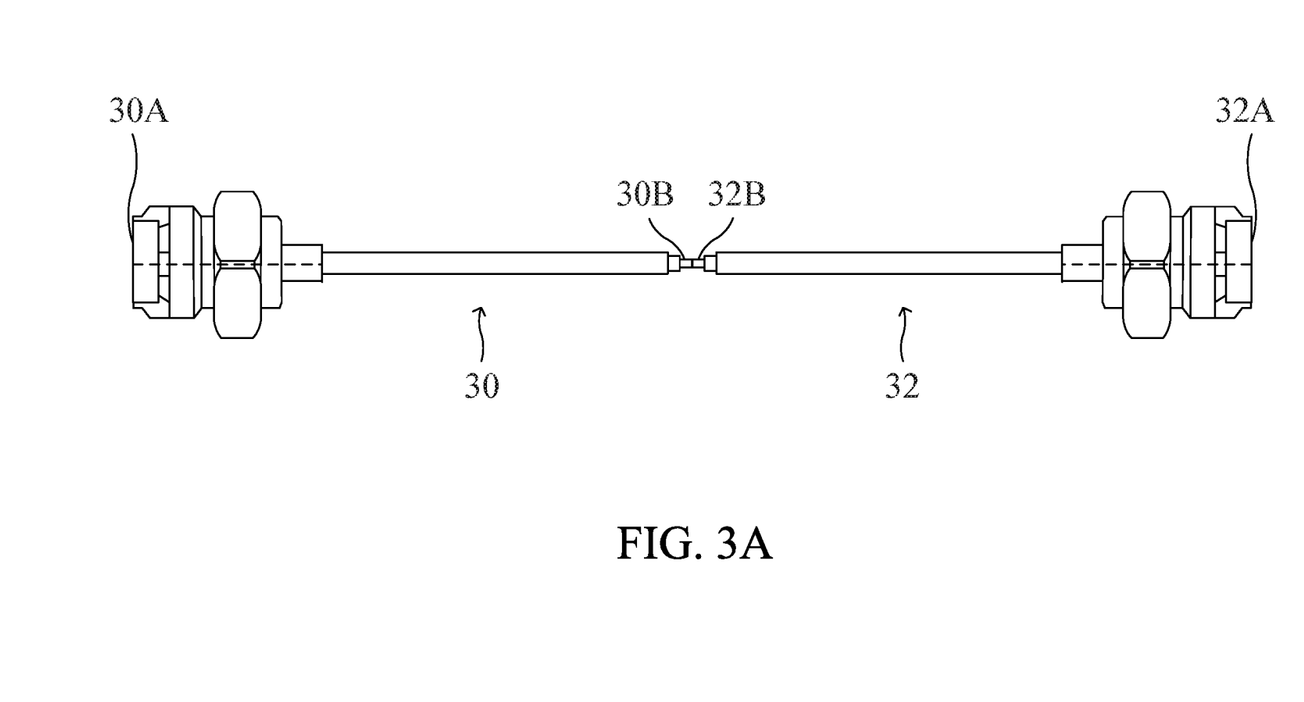
FIG. 3A is a schematic diagram illustrating an embodiment of measuring means for executing a certain stage of the method of FIG. 2A according to the present invention.
Figure 3B:
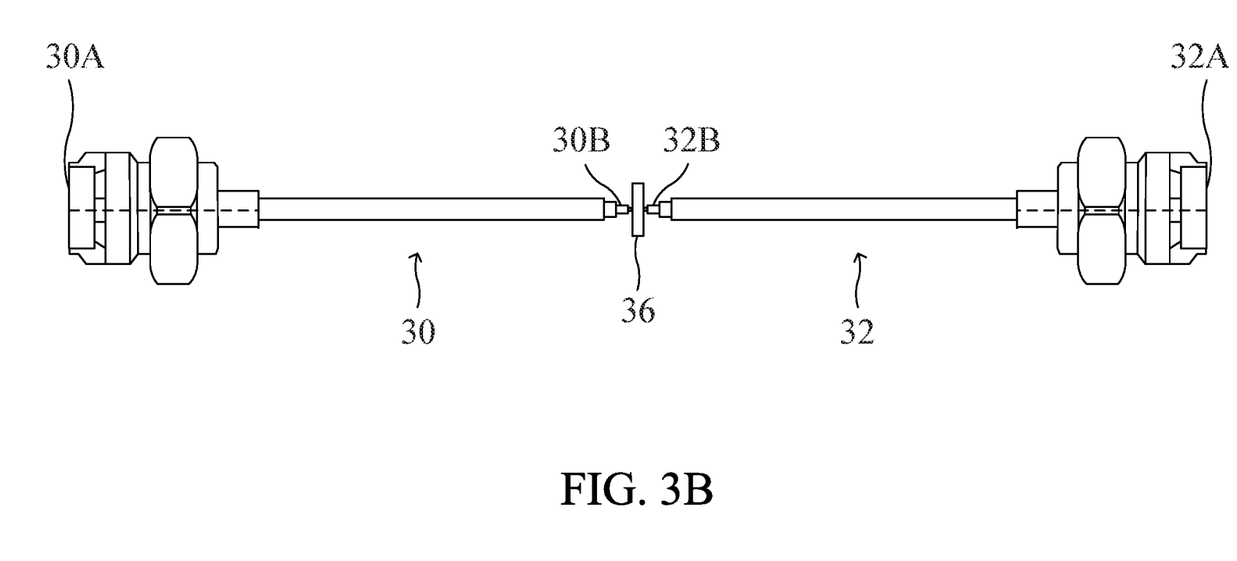
FIG. 3B is a schematic diagram illustrating an embodiment of measuring means for executing another stage of the method of FIG. 2A according to the present invention.

An embodiment of a method for measuring characteristic impedance of an electric transmission line according to the present invention will be illustrated hereinafter with reference to the flowchart of FIG. 2A as well as measuring means as illustrated in FIG. 3A and FIG. 3B. In this embodiment, a first probe 30 and a second probe 32 are used for measuring characteristic impedance of the electric transmission line 36.

Please refer to FIG. 3A, in which the measuring means working at a first stage, i.e. Stage S10 as shown in the flowchart of FIG. 2A, is schematically illustrated. In this stage, a needle tip 30B of the first probe 30 and a needle tip 32B of the second probe 32 are in direct contact to form a physical circuit (hereinafter, a first circuit) in Step S102. Then in Step S104, an electric variation curve is obtained by measuring an electric property of the first circuit through heads 30A and 32A of the probes 30 and 32. The resulting electric variation curve is referred to as a first real measured curve. For executing the above operation, the probe 10 as shown in FIG. 1, or any other suitable probe having a head portion equivalent to the head 12A of the probe 10 and a tail portion equivalent to the needle tip 14A of the probe 10, may serve as either or each of the first probe and the second probe to configure interconnected needle tips 30B and 32B, and conduct measurement via heads 30A and 32A.

Subsequently, the first real measured curve obtained in Step S104 is based on to measure characteristic impedance in Step S106. It is to be noted that the measured object at this stage is the first circuit, and the characteristic impedance of the first circuit is measured to obtain a first characteristic impedance. In this embodiment, Step S106 for obtaining the first characteristic impedance is executed immediately after the first real measured curve is obtained in Step S104, but it may alternatively be executed later before Step S112 for obtaining a second characteristic impedance.

It is to be noted that the first characteristic impedance measured with two interconnected individual probes 30 and 32 would include, in addition to impedance of the probes 30 and 32 themselves, impedance resulting from discontinuous electric properties at contact faces of the interconnected probes 30 and 32, which vary with practical working conditions. The impedance resulting from discontinuous electric properties at contact faces can be considered as a result of poor grounding.

Please further refer to FIG. 3B, which schematically illustrates the embodiment of measuring means working at a second stage, i.e. Stage S12 as shown in the flowchart of FIG. 2A. In this stage, terminals at opposite ends of the electric transmission line 36, whose characteristic impedance is to be measured, are electrically connected to the first probe 30 and the second probe 32, respectively, so as to form another physical circuit (hereinafter, a second circuit) as illustrated in FIG. 3B in Step S108. In practice, the first probe 30 and the second probe 32 are electrically connected with the terminals of the electric transmission line 36 with respective needle tips 30B and 32B. Then in Step S110, an electric variation curve is obtained by measuring an electric property of the second circuit through heads 30A and 32A of the probes 30 and 32. The resulting electric variation curve is referred to as a second real measured curve. In Step S112, the second real measured curve is referred to for calculating gross characteristic impedance of the second circuit. Afterwards, in a third Stage, i.e. Stage S14 as shown in the flowchart of FIG. 2A, net characteristic impedance of the electric transmission line 36 can be extracted by removing the component of the first characteristic impedance realized previously.

Practically, the gross characteristic impedance of the second circuit includes three parts, i.e. the characteristic impedance of the electric transmission line 36, the characteristic impedance of the probes 30 and 32 themselves and the characteristic impedance caused by the poor grounding. Therefore, the characteristic impedance of the electric transmission line 36 can be realized by removing the component of the first characteristic impedance from the whole second characteristic impedance.

In summary of this embodiment, in the first stage S10 including Steps S102, S104 and S106 for measuring the first characteristic impedance of the directly interconnected probes, reference characteristic impedance is realized. Then in the second stage S12 including Steps 108 and S110 for measuring the second characteristic impedance of the assembly of the electric transmission line clamped between the probes, gross characteristic impedance is realized. Finally, in the third stage S14 including Step S112, net characteristic impedance of the electric transmission line is calculated based on the reference characteristic impedance obtained in the first stage S10 and the gross characteristic impedance obtained in the second stage S12.

By way of the above-described method and measuring means according to the present invention, characteristic impedance of an electric transmission line can be readily realized. Only are a couple of measurement and calculation procedures involved. There is neither specially designed carrier nor particular type of probe required. Therefore, time and cost spent in the prior art for inspection and calibration with a carrier can be saved.

Figure 2B:
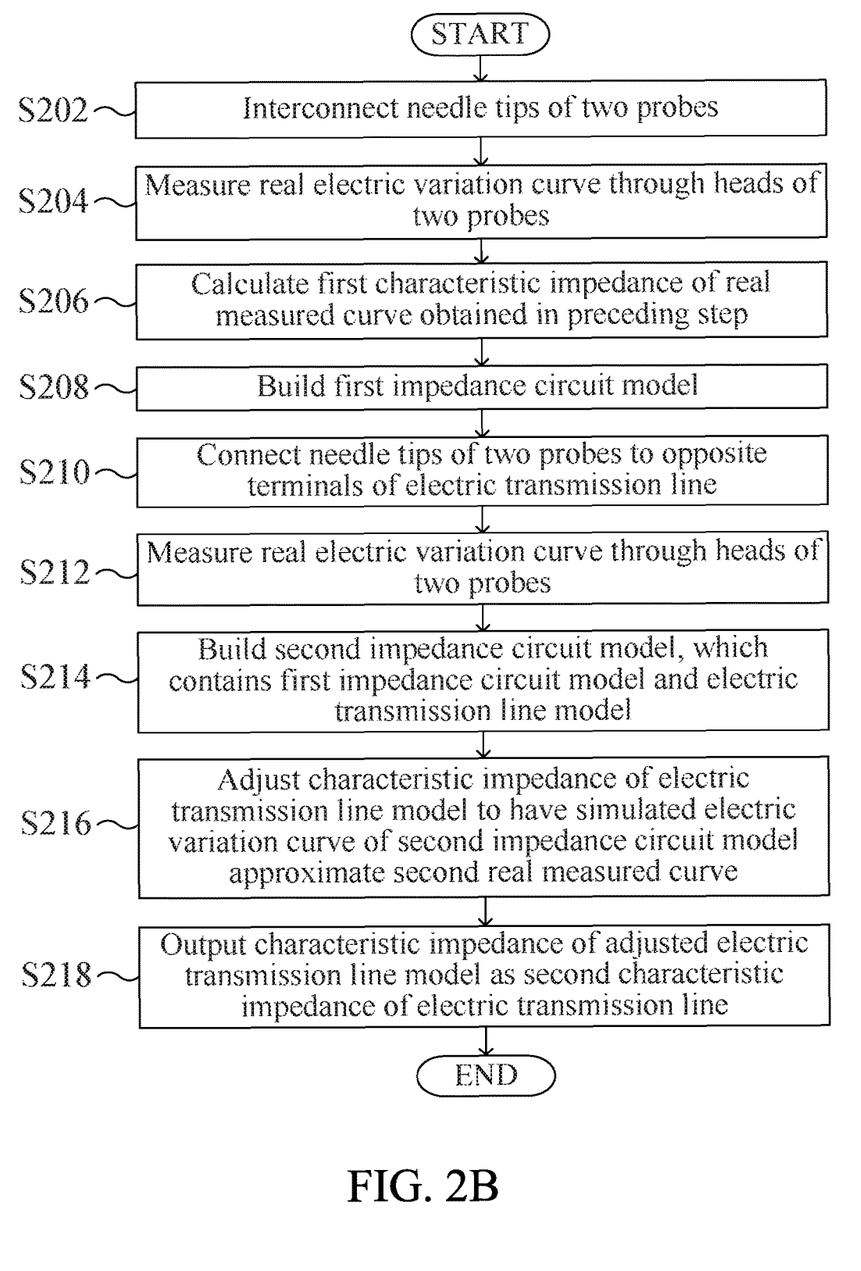
FIG. 2B is a flowchart schematically illustrating a method for measuring characteristic impedance of an electric transmission line according to another embodiment of the present invention.

FIG. 2B is a flowchart schematically illustrating a method for extracting characteristic impedance of an electric transmission line according to another embodiment of the present invention. In this embodiment, Step S202 through Step S206 are identical to Step S102 through Step S106 of the embodiment illustrated in FIG. 2A, and Step S210 through Step S212 are identical to Step S108 through Step S110 of the embodiment illustrated in FIG. 2A. Repetitive descriptions would not be redundantly presented herein.

The embodiment illustrated in FIG. 2B differs from that illustrated in FIG. 2A in introducing an equivalent circuit model. In practice, a first impedance circuit model correlating to the first characteristic impedance obtained in Step S206 is built by a software operation in Step S208. In this embodiment, Step S208 for obtaining the first characteristic impedance model is executed immediately after the first characteristic impedance is obtained in Step S206, but it may alternatively be executed later before Step S214 for building a second characteristic impedance model.

Figure 4:
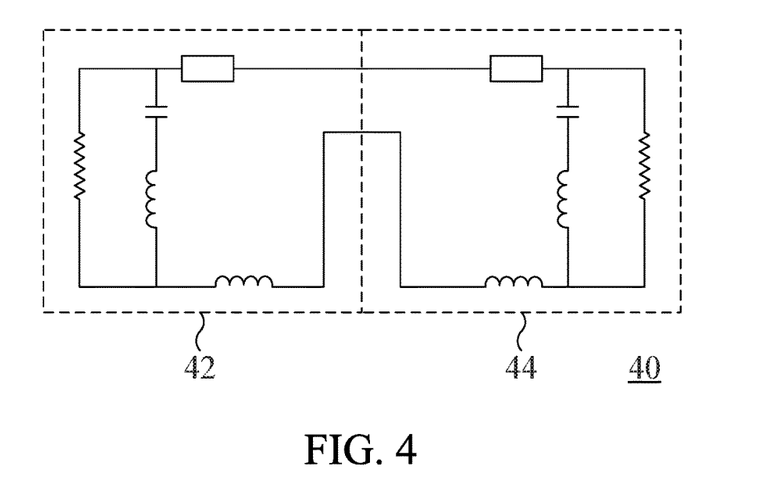
FIG. 4 is a schematic circuit block diagram illustrating an embodiment of measuring means for executing a certain stage of the method of FIG. 2B according to the present invention.

Please refer to FIG. 4, in which an embodiment of the first characteristic impedance model is schematically illustrated. As shown, the first characteristic impedance model 40 includes a first equivalent circuit model 42 and a second equivalent circuit model 44. Each of the first equivalent circuit model 42 and the second equivalent circuit model 44 is built with equivalent electronic elements such as resistor(s), conductor(s), capacitor(s) and/or inductor(s). It is required that the characteristic impedance of the whole first impedance circuit model 40 calculated by a software operation substantially equal to the first characteristic impedance realized in the preceding procedure. Furthermore, when probes of the same type are used, the impedance of the first equivalent circuit model 42 and the impedance of the second equivalent circuit model 44 are made identical.

Figure 5:
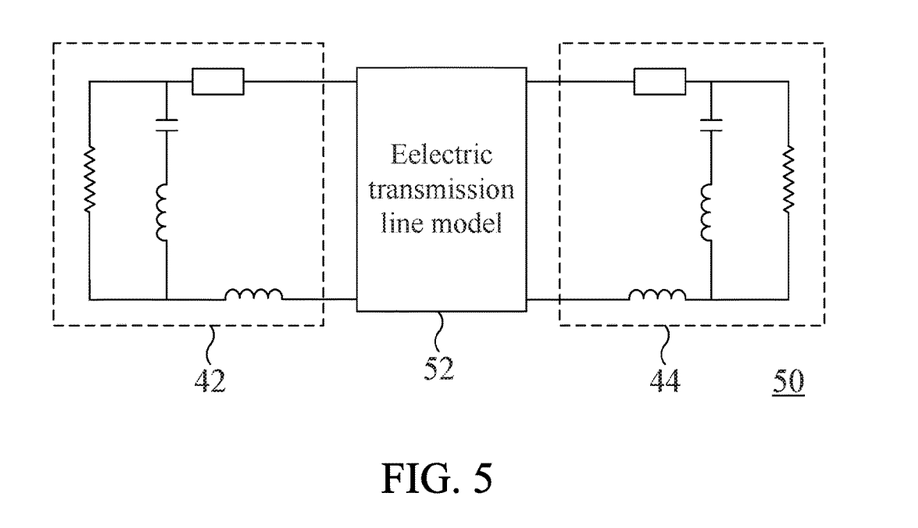
FIG. 5 is a schematic circuit block diagram illustrating an embodiment of measuring means for executing another stage of the method of FIG. 2B according to the present invention.

In this embodiment, a second equivalent circuit model 50 is further built in Step S214, which is schematically illustrated in FIG. 5. The second equivalent circuit model 50 contains the first equivalent circuit model 40 built in Step S208, and additionally, an electric transmission line model 52. As shown in FIG. 5, the electric transmission line model 52 is electrically coupled to the first equivalent circuit model 42 and the second equivalent circuit model 44 of the first equivalent circuit model 40 at opposite sides thereof. The parameters of the electronic elements constituting the first equivalent circuit model 42 and the second equivalent circuit model 44 illustrated in FIG. 4 and the first equivalent circuit model 42 and the second equivalent circuit model 44 illustrated in FIG. 5 are made identical. In this embodiment, the electric transmission line model 52 is a variable impedance circuit model. By adjusting the characteristic impedance of the electric transmission line model 52 in a software operational way, the electric variation curve simulated with the second impedance circuit model 50, hereinafter the simulated electric variation curve, would vary accordingly. In other words, Step S216 in this embodiment can have the contour of the simulated electric variation curve of the second impedance circuit model 50 approximate the second real measured curve obtained in Step S212 as much as possible by adjusting the characteristic impedance of the electric transmission line model 52. At last, as a result of proper adjustment, the contour of the simulated electric variation curve approximates the second real measured curve, and meanwhile, the characteristic impedance of the adjusted electric transmission line model can be outputted as the second characteristic impedance of the electric transmission line (Step S218). It is to be noted that the criteria for determining approximation may vary with designs and practical requirement.

It should be understood that the above-described simulating and approximating operations may be used not only for realizing the characteristic impedance of the electric transmission line model 52, but also for realizing the characteristic impedance of the first impedance circuit model 40. In this case, the first equivalent circuit model 42 and the second equivalent circuit model 44 are adjusted to have the simulated electric variation curve of the first impedance circuit model 40 approximate the first real measured curve.

Compared with the embodiment illustrated in FIG. 2A, the embodiment illustrated in FIG. 2B utilizes parameter adjustment by way of simulation software instead of mere calculation. Accordingly, similar objectives can be achieved in an alternative way.

The measuring methods and measuring means described above may be used together with a variety of fixtures and tools to measure electric properties of electric elements such as circuit on wafer, IC pins and circuit on PCB. The probes required for executing measurement according to the present invention may be used for measuring electric properties of more than one channel and transmission line independently, in parallel connection, or in a general or differential way.

According to the present invention, once the characteristic impedance of the probe-incorporated circuit, i.e. the first characteristic impedance, is known, simulation of circuit can be made based on the first characteristic impedance to readily realize the characteristic impedance of the electric transmission line in a circuitry. Furthermore, the calibration of probes with a carrier required in the prior art can be omitted. Therefore, time and cost spent for measuring characteristic impedance of an electric transmission line in a circuitry can be minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures. For example, in spite hardware devices are exemplified as above in order to practice the redundancy power supply system and the power control circuit according to the present invention, hardware/software hybrid modules or firmware designs may also adopted as alternatives of the devices when appropriate.

What is claimed is:

1. A method for measuring a characteristic impedance of an electric transmission line, comprising:
    providing a first probe and a second probe, wherein the first probe and the second probe are separable and independently operable probes;
    measuring a first characteristic impedance of a first circuit where a first terminal of the first probe and a first terminal of the second probe are directly interconnected to each other;
    measuring a second characteristic impedance of a second circuit where the first terminal of the first probe and the first terminal of the second probe are connected to opposite terminals of the electric transmission line, respectively; and
    obtaining the characteristic impedance of the electric transmission line according to the first characteristic impedance and the second characteristic impedance.

2. The method according to claim 1, wherein the first characteristic impedance of the first circuit is measured by:
    measuring a first real measured curve of the first circuit through a second terminal of the first probe and a second terminal of the second probe; and
    obtaining a characteristic impedance presented by the first real measured curve as the first characteristic impedance of the first circuit.

3. The method according to claim 1, wherein the second characteristic impedance of the second circuit is measured by:
    measuring a second real measured curve of the second circuit through a second terminal of the first probe and a second terminal of the second probe; and
    obtaining a characteristic impedance presented by the second real measured curve as the second characteristic impedance of the second circuit.

4. The method according to claim 1, wherein the characteristic impedance of the electric transmission line is measured by:
    removing a component of the first characteristic impedance from the second characteristic impedance; and
    obtaining a difference of the first characteristic impedance and the second characteristic impedance as the characteristic impedance of the electric transmission line.

5. The method according to claim 1, further comprising:
building a first impedance circuit model correlating to the first characteristic impedance.

6. The method according to claim 5, wherein the first impedance circuit model is built by:
providing a first equivalent circuit model and a second equivalent circuit model, wherein the first equivalent circuit model and the second equivalent circuit model have the same characteristic impedance, and the characteristic impedance of the whole first impedance circuit model substantially equals to the first characteristic impedance.

7. The method according to claim 5, wherein the characteristic impedance of the electric transmission line is measured by:
building a second impedance circuit model correlating to the second characteristic impedance, wherein the second impedance circuit model contains the first impedance circuit model; and
removing a component of the first characteristic impedance from the second characteristic impedance, and obtaining a difference of the first characteristic impedance and the second characteristic impedance as the characteristic impedance of the electric transmission line.

8. The method according to claim 7, wherein the second impedance circuit model is built by:
connecting an electric transmission line model to the first impedance circuit model to form the second impedance circuit model; and
adjusting a characteristic impedance of the electric transmission line model to have a characteristic impedance of the second impedance circuit model substantially equal to the second characteristic impedance.

9. The method according to claim 8, wherein the characteristic impedance of the electric transmission line model is obtained as the characteristic impedance of the electric transmission line.

* * * * *